United States Patent
Krug et al.

(10) Patent No.: US 8,952,696 B2
(45) Date of Patent: Feb. 10, 2015

(54) SUPPLY LINE APPARATUS

(75) Inventors: Andreas Krug, Fürth (DE); Johann Schuster, Oberasbach (DE); Stefan Stocker, Großenseebach (DE)

(73) Assignee: Siemens Aktiengesellschaft, München (DE)

( * ) Notice: Subject to any disclaimer, the term of this patent is extended or adjusted under 35 U.S.C. 154(b) by 410 days.

(21) Appl. No.: 13/369,577

(22) Filed: Feb. 9, 2012

(65) Prior Publication Data

US 2013/0037297 A1    Feb. 14, 2013

(30) Foreign Application Priority Data

Feb. 10, 2011   (DE) .......................... 10 2011 003 916

(51) Int. Cl.
| | | |
|---|---|---|
| *G01V 3/00* | (2006.01) | |
| *G01R 33/36* | (2006.01) | |
| *G01R 33/385* | (2006.01) | |

(52) U.S. Cl.
CPC .............. *G01R 33/36* (2013.01); *G01R 33/385* (2013.01)
USPC ........................................................ 324/318

(58) Field of Classification Search
USPC ................................................ 324/300–322
See application file for complete search history.

(56) References Cited

U.S. PATENT DOCUMENTS

| | | | |
|---|---|---|---|
| 6,208,135 B1 * | 3/2001 | Shattil | 324/225 |
| 6,211,671 B1 * | 4/2001 | Shattil | 324/225 |
| 6,348,791 B2 * | 2/2002 | Shattil | 324/225 |
| 6,404,200 B1 * | 6/2002 | Dietz et al. | 324/318 |
| 6,552,543 B1 * | 4/2003 | Dietz | 324/318 |
| 7,568,947 B2 | 8/2009 | Schuster et al. | |
| 7,924,005 B2 | 4/2011 | Dietz et al. | |
| 2001/0019264 A1 * | 9/2001 | Shattil | 324/225 |
| 2011/0109316 A1 * | 5/2011 | Akita et al. | 324/322 |
| 2011/0248712 A1 * | 10/2011 | Grafendorfer et al. | 324/307 |

FOREIGN PATENT DOCUMENTS

DE    10 2007 007 541 A1    8/2008
DE    10 2008 021 358 A1    11/2009

OTHER PUBLICATIONS

German Office Action dated Aug. 8, 2011 for corresponding German Patent Application No. DE 10 2011 003 916.3 with English translation.

* cited by examiner

*Primary Examiner* — Dixomara Vargas

(74) *Attorney, Agent, or Firm* — Lempia Summerfield Katz LLC

(57) ABSTRACT

A supply line apparatus for an electrical connection of a gradient coil unit in a magnetic resonance device includes a first supply line unit and a second supply line unit. The second supply unit is disposed at least partially coaxially to the first supply line unit. The first supply line unit and/or the second supply line unit has at least one conducting supply line element. The supply line apparatus includes an oscillation decoupling unit that has at least one oscillation-suppressing supply line element.

20 Claims, 2 Drawing Sheets

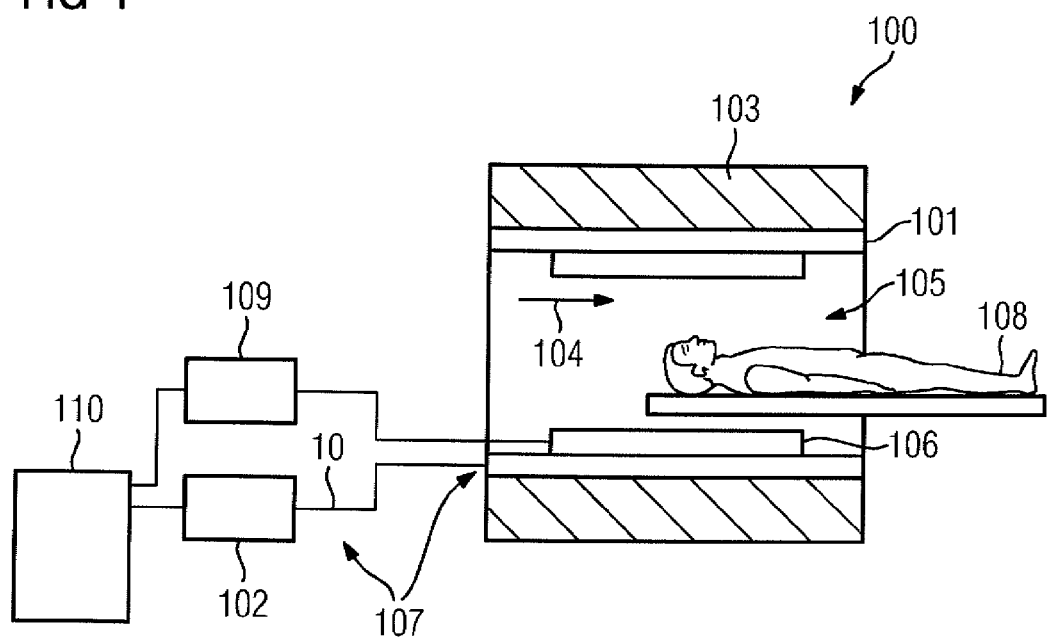

SUPPLY LINE APPARATUS

This application claims the benefit of DE 10 2011 003 916.3, filed Feb. 10, 2011.

BACKGROUND

The present embodiments relate to a supply line apparatus.

During the operation of gradient coils in a magnetic resonance device, the gradient coils are excited to oscillate. The oscillations are transmitted to supply lines for electrical connection of the gradient coils, such that the supply lines are excited to oscillate and/or vibrate in an unwanted manner. In the supply lines, the unwanted oscillations and/or vibrations may lead to defects, such as cable fractures, the detachment of cable connections on the gradient coil and/or to the overheating of the supply lines.

In order, for example, to at least partially prevent the detachment of a cable connection of the supply line on the gradient coil during operation, connection points of the supply line on the gradient coil may be fixed as securely as possible. All the oscillation energy may be transmitted to the supply lines, exposing the supply lines to significant oscillations and/or vibrations that can lead to further damage to the supply lines (e.g., a fracture of the supply line and/or overheating of the supply lines).

SUMMARY AND DESCRIPTION

The present embodiments may obviate one or more of the drawbacks or limitations in the related art. For example, a supply line apparatus, with which a transmission of electrical signals and/or current between a gradient coil and an electronic assembly is achieved economically and with low levels of wear, is provided.

In one embodiment, a supply line apparatus for, for example, an electrical connection of a gradient coil unit in a magnetic resonance device includes a first supply line unit and a second supply line unit. The second supply line unit is disposed at least partially coaxially to the first supply line unit. The first supply line unit and/or the second supply line unit have at least one conducting supply line element.

The supply line apparatus includes an oscillation decoupling unit that has at least one oscillation-suppressing supply line element. This advantageously allows the suppression of unwanted oscillations and/or vibrations that are produced during operation of the gradient coil unit and at least partially transmitted to the supply line unit. Oscillation suppression and/or oscillation decoupling allows the wear of components (e.g., the detachment of connection points and/or the fracture of cable elements) of the supply line unit to be advantageously reduced. This is an economical way of allowing the supply line apparatus to have a long service life. Further components and/or assemblies (e.g., a preamplifier that is connected by the supply line apparatus to the gradient coil unit in an electrically conducting manner) may also be decoupled from the oscillations and/or vibrations produced in the gradient coil unit.

An oscillation-suppressing supply line element may, for example, be a supply line element that has an outer form configured specifically to suppress, for example, mechanical oscillations and/or vibrations. The supply line element may be made from a specific material configured specifically to suppress, for example, mechanical oscillations and/or vibrations. The degree of oscillation suppression of the at least one oscillation-suppressing supply line element is, for example, matched to a frequency range of the oscillations and/or vibrations to be suppressed and/or to an oscillation amplitude of the oscillations and/or vibrations to be suppressed. The supply line apparatus may, for example, be formed by a coaxial cable. The first supply line unit includes an outer conductor of the coaxial cable, and the second supply line unit includes an inner conductor of the coaxial cable. The oscillation decoupling unit is advantageously disposed between a first subregion and a second subregion of the coaxial cable along a longitudinal direction of the coaxial cable.

The conducting supply line element of the first supply line unit and/or the second supply line unit is formed at least partially by the oscillation-suppressing supply line element of the oscillation decoupling unit. Additional components are advantageously not required, and an economical supply line apparatus may thus be provided. The oscillation-suppressing supply line element may be formed from any number of materials. In one embodiment, the oscillation-suppressing supply line element may be formed from a copper alloy in order to achieve a high level of electrical conductivity in the oscillation-suppressing supply line element.

The first supply line unit and/or the second supply line unit includes at least the oscillation-suppressing supply line element and at least one further conducting supply line element. The oscillation-suppressing supply line element is coupled to the further conducting supply line element in a conducting manner. A further conducting supply line element may, for example, be a supply line element with a high level of electrical conductivity. The function of the supply line element is essentially limited to a supply line for electrical current and/or electrical signals such as, for example, an outer conductor and/or an inner conductor of a conventional coaxial cable. In addition to oscillation suppression, an electrically conducting function of the oscillation-suppressing supply line elements may also be advantageously provided. The oscillations and/or vibrations may also be absorbed within the oscillation decoupling unit, thereby keeping the remainder of the supply line apparatus (e.g., the remainder of the coaxial cable) essentially oscillation-free and/or vibration-free. In one embodiment, the at least one oscillation-suppressing supply line element may be connected in a fixed manner to the at least one further conducting supply line element. The connection between the oscillation-suppressing supply line element and the further conducting supply line element may be formed by a soldered connection, a welded connection, a crimped connection, and/or further connections.

The oscillation-suppressing supply line element is advantageously formed by an oscillation-suppressing cable element (e.g., an electrically conducting cable element), allowing the function of oscillation suppression to be achieved in combination with the function of electrical conduction in the oscillation-suppressing supply line element in a structurally simple manner. A compact oscillation decoupling unit may also be provided.

In one embodiment, the at least one oscillation-suppressing supply line element is formed by a spring element, thereby achieving a structurally simple arrangement of the oscillation decoupling unit within the supply line apparatus (e.g., within the coaxial cable). A spring element may, for example, be an elastic element. The spring element, due to a form of the spring element, converts, for example, mechanical kinetic energy to a further energy form (e.g., thermal energy), so that oscillations and/or vibrations may be suppressed as a result. The degree of oscillation suppression is fixed and/or set by a spring constant of the spring element. The spring element is a function of the number of windings of the spring element and the diameter of the windings.

In one embodiment, the first supply line unit has at least one first oscillation-suppressing supply line element, and the second supply line unit has at least one second oscillation-suppressing supply line element. The at least one first oscillation-suppressing supply line element is disposed at least partially concentrically to the at least one second oscillation-suppressing supply line element. This allows unwanted forces (e.g., Lorentz forces) that are induced by a flow of electrical current in the oscillation-suppressing supply line elements within a basic magnetic field of the magnetic resonance device to be advantageously suppressed, since the Lorentz forces of the first oscillation-suppressing supply line element and of the second oscillation-suppressing supply line element advantageously cancel each other out due to the concentric arrangement.

The oscillation-suppressing and/or oscillation-decoupled effect of the at least one oscillation-suppressing supply line element within the oscillation decoupling unit may be advantageously assisted in a structurally simple manner if the oscillation decoupling unit has at least one further oscillation-suppressing element.

In one embodiment, the at least one further oscillation-suppressing element is formed at least partially by an insulator. Using the insulator, a direct and/or electrically conducting contact between the two oscillation-suppressing supply line elements may advantageously be prevented during oscillation suppression. An insulator in this context may, for example, be an oscillation-suppressing element made of a non-conducting material with a low electrical conductivity value. The at least one further oscillation-suppressing element may, for example, be formed from an elastomer polyurethane foam such as, for example, Sylodyn. The oscillation-suppressing supply line elements of the oscillation decoupling unit may be held in place in the elastomer polyurethane foam.

In one embodiment, the oscillation decoupling unit has at least one sensor unit to detect a temperature. This allows unwanted overheating of the at least one oscillation-suppressing supply line element to be advantageously prevented during oscillation suppression. The sensor unit may be disposed at a minimal distance from the at least one oscillation-suppressing supply line element and may be disposed directly thereon, so that direct temperature detection may take place.

In one embodiment, a gradient coil unit having a gradient coil, an amplifier unit and a supply line apparatus is provided. The supply line apparatus connects the gradient coil to the amplifier unit in an electrically conducting manner for a signal and/or data transmission.

The supply line apparatus has an oscillation decoupling unit to reduce mechanical oscillations. This allows unwanted oscillations and/or vibrations that are produced during operation of the gradient coil and transmitted at least partially to the supply line unit to be advantageously suppressed. Oscillation suppression and/or oscillation decoupling allows the wear of components (e.g., the detachment of connection points and/or the fracture of cable elements) of the supply line unit to be advantageously reduced. This is an economical way of allowing the supply line apparatus to have a long service life. Further components and/or assemblies (e.g., the amplifier unit) that are connected by the supply line apparatus to the gradient coil unit in an electrically conducting manner may also be decoupled from the oscillations and/or vibrations produced in the gradient coil unit.

In one embodiment, a magnetic resonance device includes a gradient coil, an amplifier unit, and a supply line apparatus. The supply line apparatus connects the gradient coil to the amplifier unit in an electrically conducting manner for a signal and/or data transmission.

The supply line apparatus has an oscillation decoupling unit to reduce mechanical oscillations.

BRIEF DESCRIPTION OF THE DRAWINGS

FIG. 4 shows a schematic diagram of one embodiment of a magnetic resonance device.

DETAILED DESCRIPTION OF THE DRAWINGS

Figure 1:
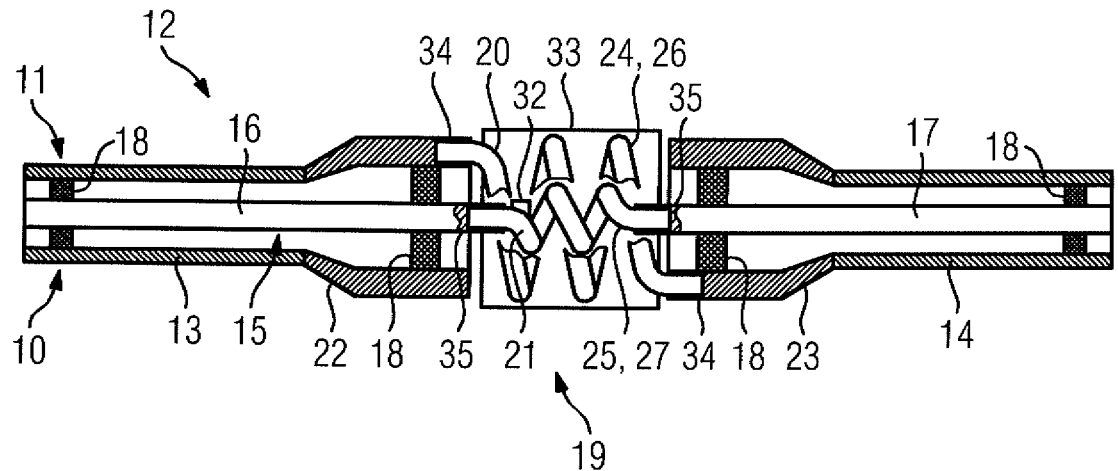
FIG. 1 shows a schematic diagram of one embodiment of a supply line apparatus.

FIG. 1 shows a schematic diagram of one embodiment of a supply line apparatus 10. The supply line apparatus 10 is formed by a coaxial cable 11. The coaxial cable 11 is configured to connect a gradient coil 101 to a further component (e.g., an amplifier unit 102) in a magnetic resonance device 100. An alternative application of the supply line apparatus 10 is also possible at any time.

The supply line apparatus 10 includes a first supply line unit 12 having a first conducting supply line element 13. The first conducting supply line element 13 is formed by an outer conductor 14 of the coaxial cable 11. The supply line apparatus 10 also includes a second supply line unit 15 having a second conducting supply line element 16. The second conducting supply line element 16 is formed by an inner conductor 17 of the coaxial cable 11. Disposed between the inner conductor 17 and the outer conductor 14 of the coaxial cable 11 are insulating elements 18 that isolate the inner conductor 17 spatially from the outer conductor 14. The insulating elements 18 are disposed at a distance from one another along a longitudinal extension of the coaxial cable 11 or a transport direction of data and/or signals of the coaxial cable 11. The outer conductor 14 of the coaxial cable 11 is, for example, disposed concentrically and/or coaxially around the inner conductor 17 of the coaxial cable 11 (see FIG. 1).

During operation of the gradient coil 101 or the magnetic resonance device 100, oscillations and/or vibrations (e.g., unwanted oscillations and/or vibrations) are produced within the gradient coil 101. The oscillations and/or the vibrations are also transmitted to the supply line apparatus 10. To suppress the unwanted oscillations and/or vibrations within the coaxial cable 11, the coaxial cable 11 has an oscillation decoupling unit 19 having a first oscillation-suppressing supply line element 20 and a second oscillation-suppressing supply line element 21 (e.g., two oscillation-suppressing supply line elements). The oscillation decoupling unit 19 is, for example, disposed along the longitudinal extension within the coaxial cable 11 between a first subregion 22 and a second subregion 23 of the coaxial cable 11 (e.g., as shown in FIG. 1).

The first oscillation-suppressing supply line element 20 is, for example, encompassed by the first supply line unit 12, and the second oscillation-suppressing supply line element 21 is encompassed by the second supply line unit 15. The first oscillation-suppressing supply line element 20 and the second oscillation-suppressing supply line element 21 are, for example, configured as conducting supply line elements of the first and second supply line units 12, 15, respectively. The two oscillation-suppressing supply line elements 20, 21 are, for example, formed from an electrically conducting material. In one embodiment, the two oscillation-suppressing supply line elements 20, 21 are formed from a copper material and/or a copper alloy. Alternatively or additionally, the two oscillation-suppressing supply line elements 20, 21 may also be formed from a steel alloy and/or other electrically conducting materials.

Figure 2:
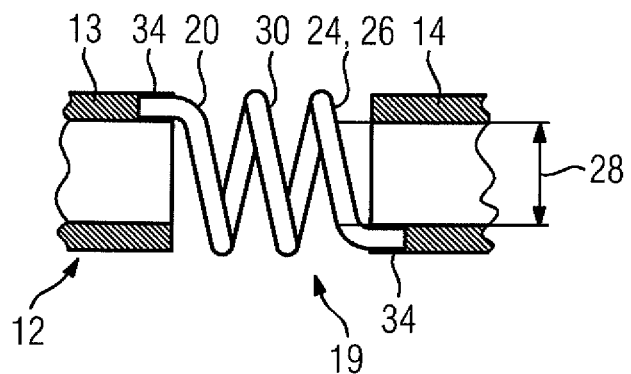
FIG. 2 shows one embodiment of a first supply line unit having an oscillation-suppressing supply line element.
Figure 3:
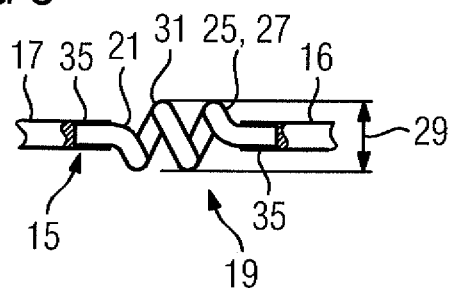
FIG. 3 shows one embodiment of a second supply line unit having an oscillation-suppressing supply line element.

The first and second oscillation-suppressing supply line elements 20, 21 are respectively configured as oscillation-suppressing cable elements 24, 25 of the coaxial cable 11. In one embodiment, the first and second oscillation-suppressing supply line elements 20, 21 are also respectively formed by an elastic spring element 26, 27. The two elastic spring elements 26, 27 are configured as helical springs (see FIGS. 1 to 3). The two oscillation-suppressing supply line elements 20, 21 configured as spring elements 26, 27 have a form that is specifically suited to oscillation suppression within the oscillation decoupling unit 19. In one embodiment, the two oscillation-suppressing supply line elements 20, 21 may also have a form that is different from a helical spring. The diameter of windings 30 of the first oscillation-suppressing supply line element 20 is, for example, greater than the diameter of windings 31 of the second oscillation-suppressing supply line element 21. An internal diameter 28 of the windings 30 of the first oscillation-suppressing supply line element 20 is, for example, greater than an external diameter 29 of the windings 31 of the second oscillation-suppressing supply line element 21. The first oscillation-suppressing supply line element 20 is also disposed concentrically and/or coaxially around the second supply line element 21, as shown in more detail in FIG. 1.

A value of a spring constant of the individual spring elements 26, 27 is, for example, matched to an expected oscillation behavior and/or vibration behavior of the coaxial cable 11 during operation of the gradient coil 101 or the magnetic resonance device 100. The value of the spring constant of the individual spring elements 26, 27 is, for example, a function of a number of windings 30, 31 for the individual oscillation-suppressing supply line elements 20, 21 and also of a diameter of the windings 30, 31. The value of the spring constant for the individual spring elements 26, 27 is set during the production process of the individual spring elements 26, 27 or of the coaxial cable 11.

The first oscillation-suppressing supply line element 20 is coupled in a conducting manner to the outer conductor 14 of the first supply line unit 12, and the second oscillation-suppressing supply line element 21 is coupled in a conducting manner to the inner conductor 17 of the second supply line unit 15. The first oscillation-suppressing supply line element 20 is connected in a fixed manner to the outer conductor 14, and the second oscillation-suppressing supply line element 21 is connected in a fixed manner to the inner conductor 17 of the coaxial cable 11. The two oscillation-suppressing supply line elements 20, 21 may, for example, be soldered and/or welded to the inner conductor 14 or the outer conductor 17. In one embodiment, the coaxial cable 11 or the first supply line unit 12 and the second supply line unit 15 each has two connector sockets 34, 35 to receive the oscillation-suppressing supply line elements 20, 21. A first connector socket 34, 35 is disposed in a first subregion 22, and a second connector socket 34, 35 is disposed in a second subregion 23 of the coaxial cable 11. In one region of the connector sockets 34, 35, the first supply line unit 12, for example, has a larger cross-sectional surface than a cross-sectional surface of the first supply line unit 12 in the remainder of the coaxial cable 11.

The oscillation decoupling unit 19 also includes a sensor unit 32 (FIG. 1) that is provided to detect a temperature of the oscillation-suppressing supply line elements 20, 21. This prevents overheating of the oscillation-suppressing supply line elements 20, 21 and/or reduces and/or prevents bend losses during oscillation suppression and/or oscillation decoupling within the oscillation-suppressing supply line elements 20, 21. The sensor unit 32 is disposed on the second oscillation-suppressing supply line element 21. The arrangement of the sensor unit 32 may, for example, be varied depending on the embodiment of the oscillation decoupling unit 19 or the individual oscillation-suppressing supply line elements 20, 21. An arrangement in a region of the oscillation-suppressing supply lines 20, 21, in which a large amount of thermal energy is released for oscillation suppression, may be provided so that precise detection of the temperature of the oscillation-suppressing supply lines 20, 21 is possible.

More than one sensor unit 32 may also be provided to detect the temperature of the oscillation decoupling unit 19. For example, one sensor unit 32 may be disposed on each of the two oscillation-suppressing supply lines 20, 21 of the oscillation decoupling unit 19. The sensor unit 32 may be formed by any number of sensor units 32 for detecting a temperature (e.g., a negative temperature coefficient (NTC) thermistor or a PT100 resistance sensor).

The oscillation decoupling unit 19 also includes at least one further oscillation-suppressing element 33 that is formed by a non-conducting element or insulator (FIG. 1), so that, for example, current-conducting between the two oscillation-suppressing supply line elements 20, 21 is prevented. The further oscillation-suppressing element 33 is formed from an elastomer polyurethane foam such as, for example, Sylodyn. The two oscillation-suppressing supply lines 20, 21 of the oscillation decoupling unit 19 are, for example, held in place in the elastomer polyurethane foam, so that for the purpose of oscillation suppression there is direct contact between the elastomer polyurethane foam and the oscillation-suppressing supply line elements 20, 21. Thus, oscillation energy may be transmitted directly to the elastomer polyurethane foam to suppress oscillation. The further oscillation-suppressing element 33 may also be drawn over the two oscillation-suppressing supply lines 20, 21, so that there is an oscillation-suppressing layer disposed around each of the two oscillation-suppressing supply lines 20, 21. The further oscillation-suppressing element 33 of the oscillation decoupling unit 19 may also be formed from further elastomer and/or elastic materials that also have the effect of an insulator with a low electrical conductivity.

FIG. 4 shows the magnetic resonance device 100 in more detail. The magnetic resonance device 100 includes a main magnet 103 to produce a homogeneous and constant main magnetic field 104. The main magnet 103 is configured as a cylindrical main magnet with a receiving region 105 for receiving a patient 108 being disposed within a cylinder of the main magnet 103 for a magnetic resonance examination. Also disposed within the cylinder are a gradient coil 101 and a high-frequency coil 106 of the magnetic resonance device 100. The gradient coil 101 and the high-frequency coil 106 are disposed around the receiving region 105.

The gradient coil 101 is part of a gradient coil unit 107 of the magnetic resonance device 100. The gradient coil unit includes the amplifier unit 102 and the supply line apparatus 10, as well as the gradient coil 101. The gradient coil 101 is connected to the amplifier unit 102 by the supply line apparatus 10, so that during operation of the magnetic resonance device 100, a signal and/or data transmission may take place between the gradient coil 101 and the amplifier unit 102 by way of the supply line apparatus 10. The magnetic resonance device 100 also includes a high-frequency control unit 109 and a control unit 110. The control unit 110 controls the high-frequency control unit 109 and the amplifier unit 102.

The illustrated magnetic resonance apparatus 100 may include further components. A general mode of operation of a magnetic resonance apparatus 100 is also known, so there is no need for a detailed description of the general components.

During operation of the gradient coil 101, oscillations and/or vibrations that are transmitted to the supply line apparatus 10 are produced. To protect the supply line apparatus 10 against defects due to the oscillations and/or vibrations, the oscillation decoupling unit 19 of the supply line apparatus 10 is configured so that the oscillation energy and/or vibration energy of the oscillations and/or vibrations produced in the gradient unit 101 are absorbed in a specific manner by the oscillation decoupling unit 19. The number of windings 30, 31 and the diameter of the individual windings 30, 31 of the individual spring elements 26, 27 of the oscillation decoupling unit 19 are matched to an expected intensity of the oscillation and/or vibrations. Both ends of the supply line apparatus 10 or of the coaxial cable 11 are fastened in a fixed manner to the gradient coil 101 or to the amplifier unit 102, so that essentially all the oscillations and/or vibrations may be transmitted to the oscillation decoupling unit 19 during operation of the gradient coil 101.

The oscillation decoupling unit 19 therefore allows oscillation suppression to be achieved so that the remainder of the coaxial cable 11 is essentially oscillation-free and/or vibration-free during operation of the gradient coil 101.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A supply line apparatus for an electrical connection of a gradient coil unit in a magnetic resonance device, the supply line apparatus comprising:
   a first supply line unit, wherein the first supply line unit is an outer conductor of a coaxial cable;
   a second supply line unit that is disposed at least partially coaxially to the first supply line unit, wherein the second supply line unit is an inner conductor of the coaxial cable; and
   an oscillation decoupling unit comprising at least one oscillation-suppressing supply line element,
   wherein the first supply line unit, the second supply line unit, or the first supply line unit and the second supply line unit comprise at least one conducting supply line element.

2. The supply line apparatus as claimed in claim 1, wherein the at least one conducting supply line element of the first supply line unit, the second supply line unit, or the first supply line unit and the second supply line unit is formed at least partially by the at least one oscillation-suppressing supply line element of the oscillation decoupling unit.

3. The supply line apparatus as claimed in claim 2, wherein the first supply line unit, the second supply line unit, or the first supply line unit and the second supply line unit comprise the at least one oscillation-suppressing supply line element and at least one further conducting supply line element, and
   wherein the at least one oscillation-suppressing supply line element is conductively coupled to the further conducting supply line element.

4. The supply line apparatus as claimed in claim 3, wherein the at least one oscillation-suppressing supply line element is connected in a fixed manner to the at least one further conducting supply line element.

5. The supply line apparatus as claimed in claim 2, wherein the at least one oscillation-suppressing supply line element is formed by an oscillation-suppressing cable element.

6. The supply line apparatus as claimed in claim 2, wherein the at least one oscillation-suppressing supply line element is formed by a spring element.

7. The supply line apparatus as claimed in claim 2, wherein the first supply line unit comprises at least one first oscillation-suppressing supply line element,
   wherein the second supply line unit comprises at least one second oscillation-suppressing supply line element, and
   wherein the at least one first oscillation-suppressing supply line element is disposed at least partially concentrically to the at least one second oscillation-suppressing supply line element.

8. The supply line apparatus as claimed in claim 2, wherein the oscillation decoupling unit comprises at least one further oscillation-suppressing element.

9. The supply line apparatus as claimed in claim 8, wherein the at least one further oscillation-suppressing element is formed at least partially by an insulator.

10. The supply line apparatus as claimed in claim 2, wherein the oscillation decoupling unit comprises at least one sensor unit operable to detect a temperature.

11. The supply line apparatus as claimed in claim 1, wherein the first supply line unit, the second supply line unit, or the first supply line unit and the second supply line unit comprise the at least one oscillation-suppressing supply line element and at least one further conducting supply line element, and
   wherein the at least one oscillation-suppressing supply line element is conductively coupled to the further conducting supply line element.

12. The supply line apparatus as claimed in claim 11, wherein the at least one oscillation-suppressing supply line element is connected in a fixed manner to the at least one further conducting supply line element.

13. The supply line apparatus as claimed in claim 1, wherein the at least one oscillation-suppressing supply line element is formed by an oscillation-suppressing cable element.

14. The supply line apparatus as claimed in claim 1, wherein the at least one oscillation-suppressing supply line element is formed by a spring element.

15. The supply line apparatus as claimed in claim 1, wherein the first supply line unit comprises at least one first oscillation-suppressing supply line element,
   wherein the second supply line unit comprises at least one second oscillation-suppressing supply line element, and
   wherein the at least one first oscillation-suppressing supply line element is disposed at least partially concentrically to the at least one second oscillation-suppressing supply line element.

16. The supply line apparatus as claimed in claim 1, wherein the oscillation decoupling unit comprises at least one further oscillation-suppressing element.

17. A supply line apparatus for an electrical connection of a gradient coil unit in a magnetic resonance device, the supply line apparatus comprising:
   a first supply line unit;
   a second supply line unit that is disposed at least partially coaxially to the first supply line unit; and an oscillation decoupling unit comprising at least one oscillation-suppressing supply line element,
wherein the first supply line unit, the second supply line unit, or the first supply line unit and the second supply line unit comprise at least one conducting supply line element,
wherein the oscillation decoupling unit comprises at least one further oscillation-suppressing element, and
wherein the at least one further oscillation-suppressing element is formed at least partially by an insulator.

18. A supply line apparatus for an electrical connection of a gradient coil unit in a magnetic resonance device, the supply line apparatus comprising:
   a first supply line unit;
   a second supply line unit that is disposed at least partially coaxially to the first supply line unit; and
   an oscillation decoupling unit comprising at least one oscillation-suppressing supply line element,
   wherein the first supply line unit, the second supply line unit, or the first supply line unit and the second supply line unit comprise at least one conducting supply line element, and
   wherein the oscillation decoupling unit comprises at least one sensor unit operable to detect a temperature.

19. A gradient coil unit comprising:
   a gradient coil;
   an amplifier unit; and
   a supply line apparatus comprising:
      a first supply line unit, wherein the first supply line unit is an outer conductor of a coaxial cable;
      a second supply line unit that is disposed at least partially coaxially to the first supply line unit, wherein the second supply line unit is an inner conductor of the coaxial cable; and
      an oscillation decoupling unit operable to reduce mechanical oscillations, the oscillation decoupling unit comprising at least one oscillation-suppressing supply line element,
   wherein the first supply line unit, the second supply line unit, or the first supply line unit and the second supply line unit comprise at least one conducting supply line element, and
   wherein the supply line apparatus connects the gradient coil to the amplifier unit in an electrically conducting manner for a signal transmission, a data transmission, or a signal and data transmission.

20. A magnetic resonance device comprising:
   a gradient coil;
   an amplifier unit; and
   a supply line apparatus comprising:
      a first supply line unit, wherein the first supply line unit is an outer conductor of a coaxial cable;
      a second supply line unit that is disposed at least partially coaxially to the first supply line unit, wherein the second supply line unit is an inner conductor of the coaxial cable; and
      an oscillation decoupling unit operable to reduce mechanical oscillations, the oscillation decoupling unit comprising at least one oscillation-suppressing supply line element,
   wherein the first supply line unit, the second supply line unit, or the first supply line unit and the second supply line unit comprise at least one conducting supply line element, and
   wherein the supply line apparatus connects the gradient coil to the amplifier unit in an electrically conducting manner for a signal transmission, a data transmission, or a signal and data transmission.

* * * * *